(12) United States Patent
Satake et al.

(10) Patent No.: US 6,208,002 B1
(45) Date of Patent: Mar. 27, 2001

(54) FIELD EFFECT TRANSISTOR AND MANUFACTURING METHOD THEREOF

(75) Inventors: Hideki Satake, Chigasaki; Akira Toriumi, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/229,567

(22) Filed: Jan. 13, 1999

(30) Foreign Application Priority Data

Mar. 26, 1998 (JP) .................................................. 10-078935

(51) Int. Cl.$^7$ ........................ H01L 31/119; H01L 31/113; H01L 29/76; H01L 29/94; H01L 31/062
(52) U.S. Cl. ............................ 257/410; 257/408; 257/382
(58) Field of Search ..................................... 257/410–412, 257/408, 382; 438/261–264, 216, 287

(56) References Cited

U.S. PATENT DOCUMENTS 5,521,127 * 5/1996 Hori ...................................... 438/264

FOREIGN PATENT DOCUMENTS 8-507175  7/1996 (JP) .
10-12609  1/1998 (JP) .

* cited by examiner

Primary Examiner—Tom Thomas
Assistant Examiner—Cuong Q Nguyen
(74) Attorney, Agent, or Firm—Oblon, Spivak, McClelland, Maier & Neustadt, P.C.

(57) ABSTRACT

In the manufacturing process of a field effect transistor, the main surface of the semiconductor layer is exposed to the atmosphere containing oxygen atoms and nitrogen atoms at first. Then, the gate insulating film is formed by introducing heavy hydrogen atoms therein such that the concentration of heavy hydrogen atoms in the interface of a gate insulating film and the gate electrode is higher than that of a middle portion of the gate insulating film located in the middle of the gate insulating film in the direction of the thickness of the gate insulating film. Subsequently, the gate electrode is formed on the gate insulating film. Then, source and drain regions are formed on the main surface of the semiconductor layer to sandwich the gate electrode therebetween. By virtue of the above-mentioned method, a gate insulating film having a small thickness and high electric stability can be obtained.

22 Claims, 2 Drawing Sheets

FIELD EFFECT TRANSISTOR AND MANUFACTURING METHOD THEREOF

BACKGROUND OF THE INVENTION

This invention relates to a field effect transistor having a gate oxynitride film containing heavy hydrogen atoms, and a manufacturing method thereof.

In an element such as an electrically writable, erasable, and programmable read only memory (EEPROM), an electric field of 10 MV/cm or higher is applied to a gate oxide film in reading/erasing the information stored in the memory, and the gate oxide film is used as a tunnel oxide film. When the gate oxide film is applied with so high electric field, electrons energized by the high electric field pass through the gate oxide film. Accordingly, the gate insulating film is required to have high voltage withstand capability. If the gate insulating film is not formed to withstand such a high electric field, the impurity such as boron in the gate electrode is introduced into the gate insulating film to reach the substrate surface though the gate insulating film. The impurity concentration of the substrate surface is deviated from the desired level thereby, and thus the normal transistor characteristics may not be obtained.

Conventionally, the manufacturing condition of the gate oxide film has been determined empirically: various oxide films are formed by varying parameters such as a forming temperature and the concentration of the oxygen contained in the atmosphere; the electric characteristics of the formed films are evaluated thereafter; and then the oxide film satisfying the desired specification is selected from the films. As the types of products are varied and the speed of the alternation of product generations increases, however, the above-mentioned empirical determination method of the forming condition of the oxide film becomes not so effective, and is beginning to increase the manufacturing cost.

It has been reported that the post-annealing process (for 30 minutes at 900° C.) performed in a $D_2$ atmosphere containing heavy hydrogen (DV), i.e., "deuterium" is effective to suppress the generation of the interface state at the interface of the gate oxide film and the substrate (N. S. Saks and R. W. Rendell, IEEE Trans. Vol. NS-39, pp. 2220–2229, 1992). The method disclosed by the report, however, relates to the gate oxide film alone.

BRIEF SUMMARY OF THE INVENTION

The object of the present invention is to provide a gate insulating film structure for obtaining a gate insulating film having high electric reliability and a small thickness, and the forming method of the gate insulating film, which enables the gate insulating film structure to be realized.

According to the first aspect of the present invention, the above-mentioned objects of the present invention are attained by a manufacturing method of a field effect transistor having a gate electrode formed on a semiconductor layer to hold a gate insulating film therebetween, comprises the steps of forming the gate insulating film into which heavy hydrogen atoms are implanted by exposing a main surface of the semiconductor layer to an atmosphere containing oxygen atoms and nitrogen atoms such that a concentration of the heavy hydrogen atoms in an interface between the gate insulating film and the gate electrode is higher than that of a middle portion of the gate insulating film located in the middle of the gate insulating film in a direction of a thickness of the gate insulating film, forming the gate electrode on the gate insulating film, and forming a pair source and drain regions on the main surface of the semiconductor layer so as to sandwich the gate electrode therebetween.

It is preferable that the gate insulating film forming step includes the steps of forming a silicon oxide film on the semiconductor layer, and implanting the heavy hydrogen atoms and the nitrogen atoms into the silicon oxide film by exposing the silicon oxide film to gas containing a compound of the heavy hydrogen atoms and the nitrogen atoms after the silicon oxide film forming step.

The silicon oxide film forming step may include a step of exposing the semiconductor layer to a dry oxygen atmosphere in a heated atmosphere under an atmospheric pressure.

The silicon oxide film forming step may include the steps of bubbling liquid $D_2O$, introducing mixed gas of a gas generated by the bubbling step, $D_2$ gas, and $O_2$ gas into a reactive chamber in which the semiconductor layer is located, and forming a silicon thermal oxide film containing the heavy hydrogen atoms on the semiconductor layer in a heated atmosphere.

The silicon oxide film forming step may include the steps of bubbling liquid $D_2O$, introducing mixed gas of a gas generated by the bubbling step and $D_2O$ gas into a reactive chamber in which the semiconductor layer is located, and forming a silicon thermal oxide film containing the heavy hydrogen atoms on the semiconductor substrate in a heated atmosphere.

The silicon oxide film forming step may include a step of exposing the semiconductor substrate to an atmosphere containing activated oxygen in a heated atmosphere under a reduced pressure.

It is also preferable that the heavy hydrogen atoms and the nitrogen atoms introducing step includes a step of exposing the main surface of the semiconductor layer on which the silicon oxide film is formed to $ND_3$ gas in a heated atmosphere under a reduced pressure.

It is further preferable to perform an ion implantation step of implanting $D^+$ ion into the silicon oxide film after the introducing the heavy hydrogen atoms and the nitrogen atoms into the silicon oxide film.

It is further preferable that the forming step of the gate electrode includes a step of forming the gate electrode by using $SiD_4$ gas and $HD_3$ gas as source gases in a heated atmosphere under a reduced pressure by means of a CVD method.

It is still further preferable to perform a step of forming an interlayer insulating film on the semiconductor layer after the forming step of the source and drain regions, the interlayer insulating film forming step including the steps of forming a silicon oxide film containing D atoms by exposing the semiconductor layer to a gas containing $SiD_4$ gas and oxygen gas, and forming a silicon oxide film containing D atoms in a heated atmosphere under a reduced pressure with use of one of $SiD_4$ gas and $Si_2D_6$ gas by means of a CVD method.

Before the forming step of the gate insulating film to which the heavy hydrogen atoms are implanted, a step of forming a region containing high concentration of D atoms in the semiconductor layer may be performed by exposing the semiconductor layer to a $D_2$ gas atmosphere in a heated atmosphere under an atmospheric pressure.

According to the present invention, a serious problem of the conventional technique, such as the deterioration of the transistor characteristics and the property of the insulating film, and bad efficiency of the insulating film selection process, which have never been solved by the conventionally known technique, can be surely solved.

More specifically, an Si—D bonding more stabilized than an Si—H bonding is formed in an interface of the gate electrode to have sufficiently high concentration, at first. Thereby the dangling bond generated in the interface of the gate electrode and the gate oxynitride film can be terminated by D atoms in the Si—D bonding. By forming the Si—D bonding in this manner, the unevenness which may be generated in the interface between the gate electrode and the insulating film can be suppressed even after performing the subsequent processes such as a heating process. The unevenness in the interface is remarkable on a silicon thermal nitride film in comparing with on a silicon oxide film. Accordingly, it is very useful to implant D atoms in a silicon thermal nitride film to stabilize the interface structure.

As described above, according to the above-mentioned first aspect of the present invention, the withstand capability of the insulating film can be improved, and the gate insulating film on the side of the gate electrode is formed to be structurally stabilized and dense, by implanting high concentration of Si—D bonding in the interface of the gate electrode and the gate oxynitride film in such a manner.

By forming the gate insulating film in this manner, the invasion of the impurity from the gate electrode into the gate insulating film can be effectively suppressed. This is because, the Si—D bonding effectively compensates a plenty of dangling bonds which the gate oxynitride film intrinsically has, thereby remarkably improve the withstand capability of the gate insulating film against a high voltage.

Further, according to the first aspect of the present invention, it is preferable that the forming step of the gate insulating film and the step of implanting heavy hydrogen atoms in the gate insulating film include a step of introducing heavy hydrogen atoms in the oxide film by exposing to a gas containing compound of heavy hydrogen atoms and nitrogen atoms after forming the oxide film on the semiconductor layer. By performing this step, a weak structure of the interface of the gate electrode and the oxynitride film can be stabilized effectively.

Further, by performing this step, the Si—N bonding having high bond energy can be introduced into the insulating film, and the dangling bonds which are generated when Si—N bonding is cut by the electrons introduced into the gate oxide film and the conventional gate oxide film contains therein so much can be reduced in amount.

In order to achieve the above-mentioned object, the field effect transistor according to the second aspect of the present invention comprises a semiconductor layer, a gate insulating film formed on a main surface of the semiconductor layer, the gate insulating film containing oxygen atoms, nitrogen atoms, and heavy hydrogen atoms, the heavy hydrogen atoms are distributed in the gate insulating film such that a concentration of the heavy hydrogen atoms is higher on an opposite side to a side contacting the semiconductor layer than that of the hydrogen atoms in a middle portion of the gate insulating film located in the middle of the gate insulating film in a direction of a thickness of the gate insulating film, a gate electrode formed on a surface of the gate insulating film, and a pair of source and drain regions formed on a main surface of the semiconductor layer so as to sandwich the gate electrode therebetween.

It is preferable that a concentration of the heavy hydrogen atoms in the gate insulating film on the side contacting the semiconductor layer is higher than that of the heavy hydrogen atoms in the middle portion.

The semiconductor layer may be a semiconductor substrate.

The transistor may further comprise a control electrode formed on the gate electrode with an insulation layer interposed therebetween.

The transistor provided with the control electrode may be embedded in EEPROM in which the transistors are required to have high voltage withstand capability.

According to the second aspect of the present invention, it is preferable that the concentration of heavy hydrogen atoms on a side of the gate insulating film, which contacts the semiconductor substrate or the semiconductor layer is higher than that of the heavy hydrogen atoms in the middle portion of the gate insulating film located in the middle of the gate insulating film in the direction of the thickness of the device.

Further, according to the first and second aspects of present invention, it is preferable to implant heavy hydrogen atoms into the entire region of the gate insulating film. A trivalent silicon atom structure is generated when a hole is trapped in a dangling bond. The trivalent silicon atoms structure links the silicon substrate with the gate electrode. The linked portion functions as a leak path of electrons to cause the dielectric breakdown of the gate oxide film.

On the other hand, a stress leakage current is generated by the dangling bond located in a substantially central portion of the gate oxide film. The dangling bond functions as a "stepping stone" of tunneling electrons. Accordingly, it is essential for obtaining a gate oxide film having a high electric reliability to form the gate oxide film so as to prevent the dangling bond from being formed in an entire region of the gate oxide film in the direction of the thickness of the gate oxide film.

The inventors of the present invention have also found that the amount of the Si—H bonding and that of the Si—O bonding having a weak bonding force are irrelevant to each other but determined in proportion to each other. Accordingly, by reducing the amount of the Si—H bondings in the entire region of the gate oxide film, a gate oxide film having remarkably high electric reliability can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the drawings.

(First embodiment)

The manufacturing method of an n-channel MOSFET according to the first embodiment of the present invention will be described below with reference to FIGS. 1A, 1B, 1C, 1D, 1E, 1F, and 1G and 2.

Figure 1A:
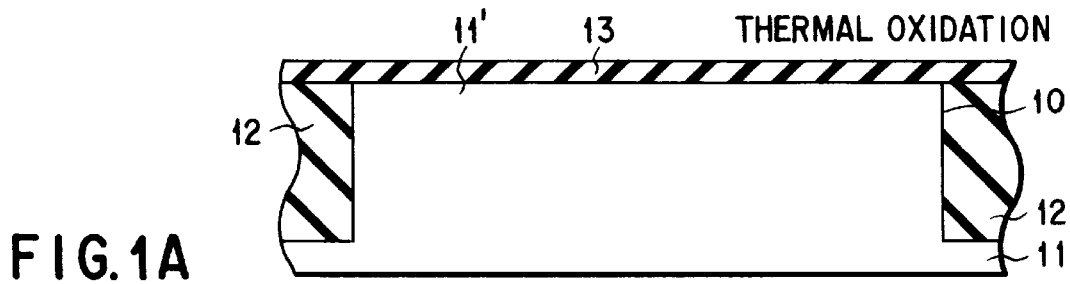
FIGS. 1A to 1G are sectional views of a field effect transistor of the present invention, which show each step of the manufacturing method of the field effect transistor.

At first, insulating material is buried in a shallow groove 10 in a main surface of a p-type silicon substrate 11, as shown in FIG. 1A. An element isolation region 12 is then formed to enclose an element region 11'. Subsequently, the device is exposed to a dry oxygen atmosphere for 10 minutes at a substrate temperature of 750° C. under the atmospheric pressure, for example, to form a silicon oxide film 13 having a thickness of 1 nm on the main surface of the p-type silicon substrate 11.

Subsequently, the substrate is exposed to the atmosphere having 10% $ND_3$ and 90% $N_2$ gas at a substrate temperature of 900° C. under the atmospheric pressure, for example, and a silicon oxide film 13 is turned into a silicon insulating film 14 containing N atoms.

Figure 1B:
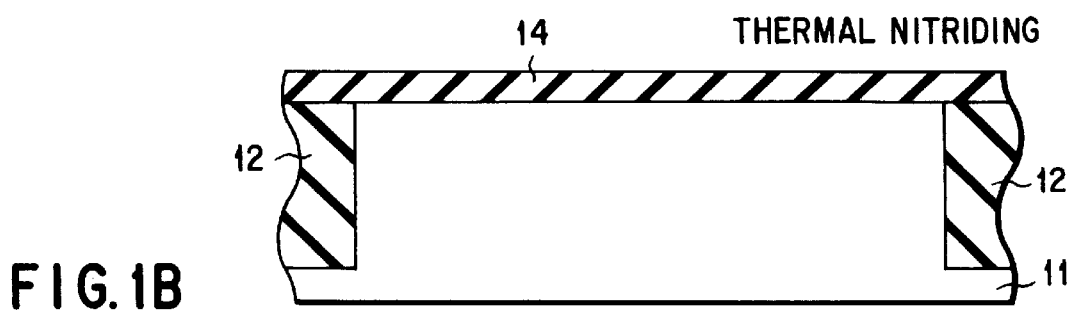
Figure 1C:
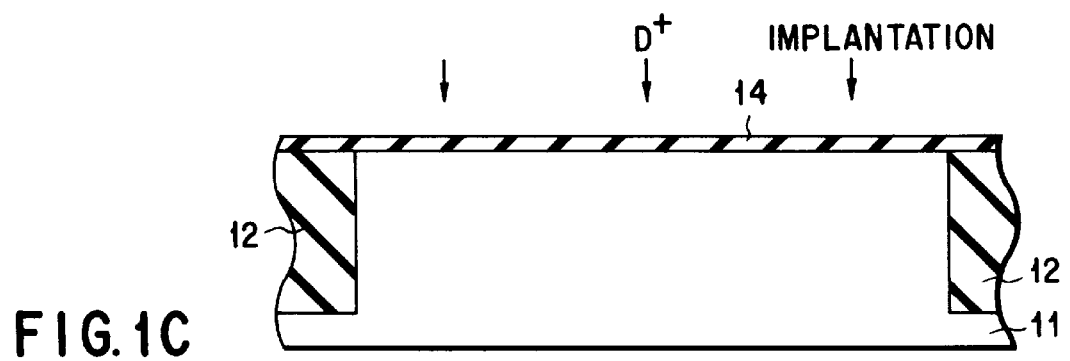

Then, on a condition of the accelerate voltage of 10 keV, for example, in a dose of $11 \times 10^{15}$ cm$^{-2}$, $D^+$ ions are implanted in a silicon insulating film 14 such that high concentration of D atoms are doped into a silicon insulating film 14, as shown in FIG. 1C.

Figure 1D:
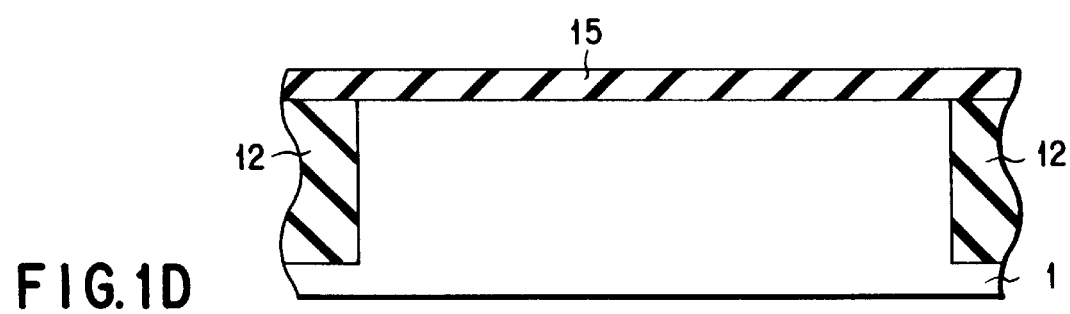

Further, the p-type silicon substrate 11 on which the silicon insulating film 14 is formed is subjected to an annealing process in $N_2$ gas atmosphere for one minute at the substrate temperature at 850° C. By performing the annealing process in such a condition, the D atoms implanted in the silicon insulating film 14 are stabilized to form a silicon insulating film (oxynitride film) 15 containing N atoms and D atoms, as shown in FIG. 1D.

Figure 2:
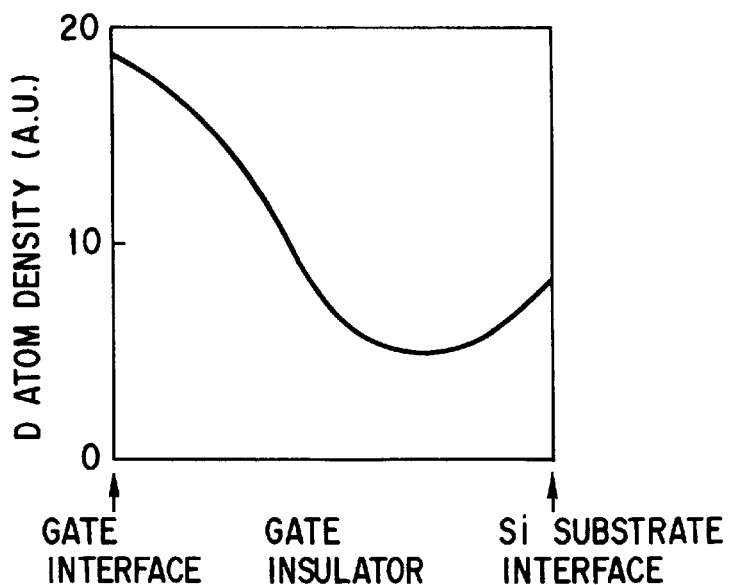
FIG. 2 is a diagram showing the concentration profile of heavy hydrogen atoms contained in a gate insulating film of the field effect transistor of the present invention in the direction of the thickness thereof.

In this time, the heavy hydrogen atoms are distributed in the silicon insulating film 15 as shown in FIG. 2. The horizontal axis in FIG. 2 represents the position in the gate insulating film 14 in the direction of the thickness of the gate insulating film 14, and the vertical axis represents the concentration of the D atoms (arbitrary amount unit). As should be clear from the diagram, according to the above-mentioned method, the gate insulating film is formed such that the D atoms concentration reaches its peak on the side of the gate electrode, i.e., on the opposite side to that contacting the silicon substrate 11. By forming the gate insulating film in this manner, the above-mentioned unevenness of the interface surface can be suppressed from being generated and the dangling bond is terminated, thereby the withstand voltage capability of the gate insulating film can be remarkably improved.

Figure 1E:
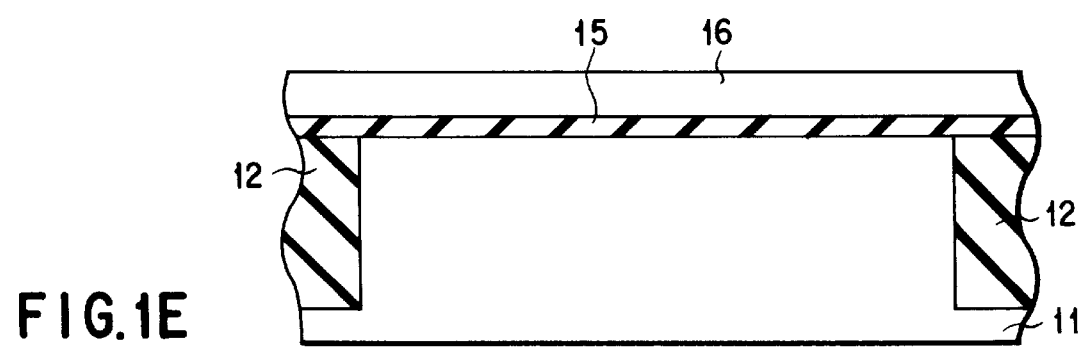

The description will return to the manufacturing process again. As shown in FIG. 1E, within the scope of the substrate temperature from 600 to 800° C., under the reduced pressure of 0.01 to 10 Torr, a polysilicon film 16 as the gate electrode is formed on the gate insulating film 15 with use of the conventionally known technique.

Figure 1F:
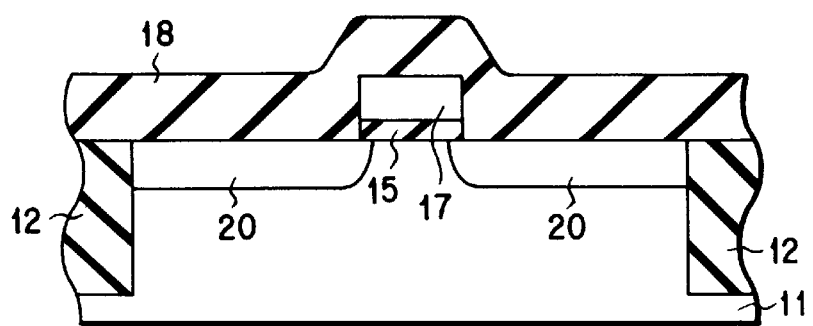

Further, as shown in FIG. 1F, a gate electrode 17 is formed by processing the polysilicon film 16 in accordance with the anisotropic etching method such as a reactive ion etching so as to be a stripe pattern extending vertically to a face on which the polysilicon film 16 is formed. After forming the gate electrode 17, the anisotropic etching is performed with use of the gate electrode 17 as a mask to process the gate insulating film 15 in the same shape as that of the gate electrode 17.

Subsequently, impurity such as arsenic ions are implanted into the main surface of the silicon substrate 11 with use of the gate electrode 17 as a mask in a condition of the acceleration voltage of 1 to 50 keV, and in a dose of $1 \times 10^{13}$ to $1 \times 10^{16}$ cm$^{-2}$. By performing the ion implantation in this manner, source and drain impurity regions 20 are formed to locate the gate electrode 17 in the midst thereof.

Next, with use of $SiD_4$ gas and $HD_3$ gas as raw material gas, a CVD silicon nitride film 18 is formed at the substrate temperature 600 to 800° C. under the reduced pressure of 0.01 to 10 Torr.

Figure 1G:
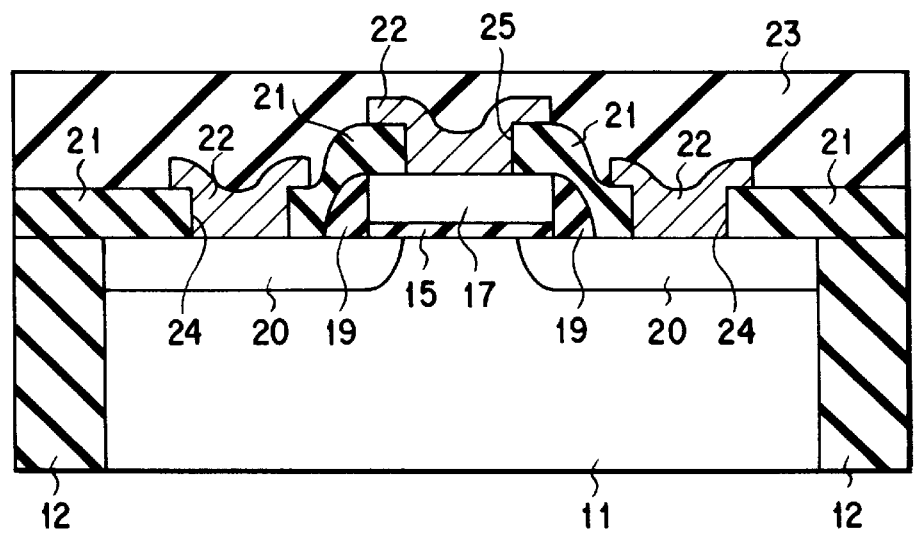

Thereafter, the anisotropic etching such as reactive ion etching is performed to form a silicon nitride film 19 on side walls of the gate electrode 17 as shown in FIG. 1G.

Further, a CVD silicon nitride film 21 is formed at a temperature of 400 to 800° C. under a pressure of 0.01 Torr or the atmospheric pressure. Thereafter, the anisotropic ion etching such as the reactive ion etching is performed to form contact holes 24 and 25 contacting the gate electrode 17, and the source and drain impurity regions 20. A metal film formed of Al or the like is formed by the sputtering or the like to bury these contact holes 24 and 25, and then the metal film is etched in wiring to form metal electrodes 22 as shown in FIG. 1G.

Next, an interlayer insulating film 23 is formed on the entire surface of the device with use of the conventionally known technique. Then, a heat treatment is performed to activate the doped impurity, thereby a MOSFET of the first embodiment is completed.

According to the first embodiment, the bonding of Si and H contained in the insulating film can be effectively cut by using high energy of introduced D ions, which is obtained by the implantation of D ions as shown in FIG. 1C. The subsequently introduced D ions have also high energy, and thus H ions are excluded from the insulating film thereby. In this manner, the dangling bond of the remaining Si can be effectively terminated. The exclusion of H ions can be said to be brought by the sputtering effect of the ion implantation.

(Second embodiment)

The second embodiment is the modification of the forming method of the gate insulating film as described in the first embodiment. Throughout the embodiments to be described below, the same processes and the same elements as those described in the first embodiment will be described with reference to FIGS. 1A, 1B, 1C, 1D, 1F, and 1G, and denoted by the reference numerals used in the first embodiment for simplicity of illustration, and the description thereof will be omitted.

At first, as shown in FIG. 1A, the shallow groove 10 formed in the main surface of the p-type silicon substrate 11 is filled with insulating material to form the element isolation region 12 so as to surround the element region 11'. Subsequently, the substrate is put into the reactive chamber and heated within a scope of the substrate temperature of 600 to 1000° C.

On the other hand, liquid $D_2O$ is bubbled outside the chamber under the atmospheric pressure, and $D_2$ gas and $O_2$ gas are added to the gas generated by the $D_2O$ bubbling. The resultant gas is introduced into the chamber to be burned above the substrate. In this manner, a silicon thermal oxide film containing D atoms is formed on the main surface of the silicon substrate 11.

Subsequently, the main surface of the silicon substrate 11 is exposed to $ND_3$ gas within the scope of the substrate temperature 600 to 1000° C. under the reduced pressure of 0.01 to 10 Torr. As a result of this exposing process, the silicon oxide film 13 is turned into the silicon oxide film 15 containing N atoms and D atoms (see FIG. 1B. The gate insulating film 14 should be regarded as "15" hereinafter).

Thereafter, the MOSFET is finished by performing the processes after the process shown in FIG. 1E in the same manner as that in the first embodiment, without performing the processes shown in FIGS. 1C and 1D, which are performed in the first embodiment (see FIG. 1E).

In the second embodiment, the processes shown in FIGS. 1C and 1D (the ion implantation and the annealing processes) are omitted, but may be performed in another case. If these processes are performed, the Si—H bonding can be reduced in comparing with the second embodiment, and thus the electrical reliability of the gate insulating film 15 can be improved.

(Third embodiment)

The third embodiment is also the modification of the method of forming the gate insulating film as described in the first embodiment.

Firstly, as shown in FIG. 1A, the shallow groove 10 formed in the main surface of the p-type silicon substrate 11 is filled with insulating material to form the element isolation region 12 surrounding the element region 11'. Thereafter, the substrate is put into the reactive chamber to be heated till the substrate temperature reaches 750° C.

On the other hand, liquid $D_2O$ is bubbled outside the chamber under the atmospheric pressure, and $D_2O$ gas is added to the gas generated by the bubbling. Then, the resultant gas is introduced into the chamber to be burned above the substrate, and the silicon thermal oxide film containing D atoms is formed on the main surface of the silicon substrate 11.

Subsequently thereto, the main surface of the silicon substrate 11 is exposed to $ND_3$ gas at the substrate temperature of 900° C. under the pressure of 0.01 to 10 Torr, whereby the silicon oxide film 13 is turned into the silicon oxide film 15 containing N atoms and D atoms (see FIG. 1B. The gate insulating film 14 should be regarded as "15" hereinafter).

The MOSFET is finished by performing the processes after the process shown in FIG. 1D in the same manner as that in the first embodiment without performing the processes shown in FIGS. 1C and 1D, which are performed in the first embodiment (see FIG. 1E).

In the third embodiment, the processes (the ion implantation and the annealing processes) shown in FIGS. 1C and 1D are omitted, but may be performed in another case. In this case, the Si—H bonding can be reduced in comparing with the third embodiment, and thus the electric reliability of the gate insulating film 15 can be improved.

(Fourth embodiment)

The fourth embodiment is also the modification of the method of forming the gate insulating film as described in the first embodiment.

At first of the process, the element isolation region 12 is formed to surround the element region 11' by filling the shallow groove 10 formed in the main surface of the p-type silicon substrate 11 with insulating material as shown in FIG. 1A. After forming the element isolation region 12, the substrate is put into the reactive chamber to be exposed to a dry oxygen atmosphere for ten minutes at the substrate temperature of 750° C., under the atmospheric pressure, whereby the silicon oxide film 13 having a thickness of 1 nm is formed.

Next, the silicon oxide film 13 is exposed to $ND_3$ gas at the substrate temperature of 900° C. under the pressure of 0.1 Torr, for example, to form the insulating film 14 containing N atoms and D atoms (see FIG. 1B).

Thereafter, the ion implantation of $D^+$ ion is performed on a condition of acceleration voltage of 1 to 50 keV, for example, and in a dose of $1\times10^{13}$ to $1\times10^{16}$ cm$^{-2}$ to implant D ions into the film with high concentration (FIG. 1C). After performing the annealing process, the gate insulating film 15 is formed thereby (see FIG. 1D).

(Fifth embodiment)

Similarly to the above-mentioned embodiments, the fifth embodiment is also the modification of the method of forming the gate insulating film of the first embodiment.

At first, the silicon substrate 11 is exposed to the atmosphere containing activated oxygen (O radical) at the substrate temperature of 550 to 950° C. under the pressure of 0.01 to 10 Torr, and with use of microwave power of 200 to 400 W, for example, and the silicon oxide film 13 is formed on the main surface of the silicon substrate 11 (FIG. 1A).

Next, at the substrate temperature of 900° C., under the pressure of 0.1 Torr, for example, the silicon substrate is exposed to $ND_3$ gas to form the insulating film 15 containing N atoms and D atoms (see FIG. 1B. The gate insulating film 14 should be regarded as "15" hereinafter).

Subsequently, without performing the processes shown in FIGS. 1C and 1D, which are performed in the first embodiment, the MOSFET is finished after performing the processes following the process shown in FIG. 1D in the same manner as that in the first embodiment (FIG. 1E).

The processes (the ion implantation and the annealing processes) shown in FIGS. 1C and 1D are omitted in the fifth embodiment, but may be performed in another case. In this case, the Si—H bonding can be reduced in comparing with the fifth embodiment. The electric reliability of the gate insulating film 15 is improved thereby.

(Sixth embodiment)

The sixth embodiment is the case wherein the present invention is applied to the forming method of the polysilicon film 16 to be formed as the gate electrode 17 described in the first embodiment.

The sixth embodiment is intended not only to reduce the Si—H bonding when the gate insulating film 15 is formed, but also to prevent the Si—H bonding from being generated in the gate insulating film 15 during the processes performed after the forming process of the gate insulating film 15.

At first, the processes shown in FIGS. 1A to 1D are performed in accordance with the method employed in the first embodiment. The polysilicon film 16 to be formed as the gate electrode 17 is formed above the main surface of the silicon substrate 11, on which the gate insulating film 15 has been formed in accordance with the LPCVD method with use of $SiD_4$ gas and $HD_3$ gas as raw material gas within the substrate temperature of 600 to 800° C. under a reduced pressure of 0.01 to 10 Torr (FIG. 1E).

The processes shown in FIGS. 1F and 1G (the forming process of the gate electrode 17, and the like) following the above-mentioned process are performed in the same manner as in the first embodiment.

In the sixth embodiment, the polysilicon film 16 is formed in accordance with the LPCVD method with use of $SiD_4$ gas and $HD_3$ gas as raw material gas, as described above. According to this manufacturing method, the generation of the Si—H bonding in the gate insulating film 15 during the forming process of the polysilicon film 16 can be prevented.

In addition thereto, the concentration of D atoms in the gate insulating film 15 can be increased by performing the solid state diffusion of D atoms from the polysilicon film 16 to the gate insulating film 15. By increasing the D atoms concentration in this manner, the electric characteristics of the gate insulating film can be improved.

(Seventh embodiment)

The seventh embodiment is the application of the present invention to the forming method of the interlayer insulating film 23 employed in the first embodiment. In the seventh embodiment, at least one of $SiD_4$ gas and $ND_3$ gas is used to form the interlayer insulating film 23.

According to this embodiment, the silicon oxide film 21 is formed to contain D atoms by exposing the surface of the silicon substrate 11 to $SiD_4$ gas and oxygen gas at the substrate temperature of 500° C. under the pressure of 0.01 to 760° C. Torr, for example.

The forming process of the interlayer insulating film 23 is performed not by using $SiD_4$ gas but by using $Si_2D_6$ gas in according to the CVD method at the substrate temperature of 500° C. under the pressure of 0.01 to 760 Torr. In this process, $SiD_4$ gas may be used.

After depositing the films 21 and 23 with use of these gases ($SiD_4$ gas, $Si_2D_6$ gas), the device may be exposed to $ND_3$ gas at the substrate temperature of 500 to 1000° C. under the pressure of 0.01 to 760 Torr. By exposing the device to $ND_3$ gas, nitrogen atoms are implanted to the interlayer insulating film, whereby the interlayer insulating film can be more stabilized than that not exposed to the $ND_3$ gas.

(Eighth embodiment)

The eighth embodiment is an application of the method of the present invention, by which D atoms are doped into the silicon substrate 11 of the first embodiment.

According to this method, the semiconductor substrate 11 is exposed to $D_2$ gas atmosphere at the substrate temperature of 1200° C. under the pressure of 760 Torr, for example, whereby a region containing high concentration of D atoms is formed in the semiconductor substrate surface. The processes after the process of forming the groove for forming the element isolation region are the same as those of the first embodiment.

It is also effective in this embodiment to use diluted DF solution in a cleaning process of the semiconductor substrate surface, instead of diluted hydrofluoric acid (diluted HF).

In the embodiments described above, the silicon substrate 11 is used as a semiconductor on which a gate insulating film of the present invention is formed. The semiconductor is not limited thereto, but another semiconductor substrate can be used thereto. Instead of the silicon substrate, for example, an SOI substrate wherein a semiconductor film is formed on the main surface of the substrate to hold an insulating film such as an oxide film therebetween can be used. In the case using such an SOI substrate structure, the gate insulating film is formed on the surface of the semiconductor layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field effect transistor comprising:
   a semiconductor layer;
   a gate insulating film on the semiconductor layer, where the gate insulating film contains oxygen atoms, nitrogen atoms and heavy hydrogen (deuterium) atoms;
   a gate electrode on the gate insulating film; and
   a pair of source and drain regions on the semiconductor layer on opposite sides of the gate electrode, wherein
   a concentration of the heavy hydrogen atoms in the gate insulating film at an interface between the gate insulating film and the gate electrode is higher than a concentration of the heavy hydrogen atoms halfway through the gate insulating film.

2. The transistor according to claim 1, wherein a concentration of the heavy hydrogen atoms in the gate insulating film on the side contacting the semiconductor layer is higher than that of the heavy hydrogen atoms in the middle portion.

3. The transistor according to claim 1, wherein the semiconductor layer is a semiconductor substrate.

4. The transistor according to claim 1, further comprising a control electrode formed on the gate electrode with an insulation layer interposed therebetween.

5. The transistor according to claim 1, wherein the heavy hydrogen atoms are distributed throughout all of the gate insulating film.

6. The transistor according to claim 1, wherein the gate insulating film includes Si—D bonds at the interface between the gate insulating film and the gate electrode.

7. The transistor according to claim 1, wherein the gate insulating film is formed by exposing a silicon oxide film formed on the semiconductor substrate to a gas containing a compound of the heavy hydrogen atoms and the nitrogen atoms.

8. The transistor according to claim 1, wherein the gate insulating film includes Si—N bonds.

9. The transistor according to claim 1, wherein the gate electrode comprises polysilicon and heavy hydrogen atoms.

10. The transistor according to claim 1, further comprising an interlayer insulating film on the gate electrode, wherein the interlayer insulating film includes heavy hydrogen atoms.

11. The transistor according to claim 1, wherein the semiconductor layer includes heavy hydrogen atoms.

12. A method of manufacturing a field effect transistor having a gate electrode formed on a semiconductor layer to hold a gate insulating film therebetween, the method comprising the steps of:
   forming the gate insulating film into which heavy hydrogen atoms are implanted by exposing a main surface of the semiconductor layer to an atmosphere containing oxygen atoms and nitrogen atoms such that a concentration of the heavy hydrogen atoms in an interface between the gate insulating film and the gate electrode is higher than that of a middle portion of the gate insulating film located in a middle of the gate insulating film in a direction of a thickness of the gate insulating film,
   forming the gate electrode on the gate insulating film,
   forming a pair of source and drain regions on the main surface of the semiconductor layer so as to sandwich the gate electrode therebetween, and
   forming the transistor of claim 1.

13. The method according to claim 1, wherein the gate insulating film forming step includes the steps of:
   forming a silicon oxide film on the semiconductor layer, and
   implanting the heavy hydrogen atoms and the nitrogen atoms into the silicon oxide film by exposing the silicon oxide film to gas containing a compound of the heavy hydrogen atoms and the nitrogen atoms after the silicon oxide film forming step.

14. The method according to claim 13, wherein the silicon oxide film forming step includes a step of exposing the semiconductor layer to a dry oxygen atmosphere in a heated atmosphere under an atmospheric pressure.

15. The method according to claim 13, wherein the silicon oxide film forming step includes the steps of:
   bubbling liquid $D_2O$,
   introducing mixed gas of a gas generated by the bubbling step, $D_2$ gas, and $O_2$ gas into a reactive chamber in which the semiconductor layer is located, and
   forming a silicon thermal oxide film containing the heavy hydrogen atoms on the semiconductor layer in a heated atmosphere.

16. The method according to claim 13, wherein the silicon oxide film forming step includes the steps of:
   bubbling liquid $D_2O$,
   introducing mixed gas of a gas generated by the bubbling step and $D_2O$ gas into a reactive chamber in which the semiconductor layer is located, and
   forming a silicon thermal oxide film containing the heavy hydrogen atoms on the semiconductor layer in a heated atmosphere.

17. The method according to claim 13, wherein the silicon oxide film forming step includes a step of exposing the semiconductor layer to an atmosphere containing activated oxygen in a heated atmosphere under a reduced pressure.

18. The method according to claim 13, wherein the heavy hydrogen atoms and the nitrogen atoms introducing step includes a step of exposing the main surface of the semiconductor layer on which the silicon oxide film is formed to $ND_3$ gas in a heated atmosphere under a reduced pressure.

19. The method according to claim 13, further comprising an ion implantation step of implanting $D^+$ ion into the silicon oxide film after the introducing the heavy hydrogen atoms and the nitrogen atoms into the silicon oxide film.

20. The method according to claim 12, wherein the forming step of the gate electrode includes a step of forming the gate electrode by using $SiD_4$ gas and $HD_3$ gas as source gases in a heated atmosphere under a reduced pressure by means of a CVD method.

21. The method according to claim 12, further comprising a step of forming an interlayer insulating film on the semiconductor layer after the forming step of the source and drain regions, the interlayer insulating film forming step including the steps of:
   forming a silicon oxide film containing D atoms by exposing the semiconductor layer to a gas containing $SiD_4$ gas and oxygen gas; and
   forming a silicon oxide film containing D atoms in a heated atmosphere under a reduced pressure with use of one of $SiD_4$ gas and $Si_2D_6$ gas by means of a CVD method.

22. The method according to claim 1, further comprising a step of forming a region containing high concentration of D atoms in the semiconductor layer by exposing the semiconductor layer to a $D_2$ gas atmosphere in a heated atmosphere under an atmospheric pressure, before the forming step of the gate insulating film to which the heavy hydrogen atoms are implanted.

* * * * *